United States Patent
Kobayashi et al.

(10) Patent No.: US 9,016,197 B2
(45) Date of Patent: Apr. 28, 2015

(54) SCREEN PRINTER AND METHOD FOR DETECTING AMOUNT OF RESIDUAL PASTE

(75) Inventors: Hiroki Kobayashi, Yamanashi (JP); Toshiyuki Murakami, Yamanashi (JP); Hideaki Mori, Yamanashi (JP); Akira Maeda, Yamanashi (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 13/979,484

(22) PCT Filed: Sep. 11, 2012

(86) PCT No.: PCT/JP2012/005770
§ 371 (c)(1),
(2), (4) Date: Jul. 12, 2013

(87) PCT Pub. No.: WO2013/114479
PCT Pub. Date: Aug. 8, 2013

(65) Prior Publication Data
US 2014/0318393 A1 Oct. 30, 2014

(30) Foreign Application Priority Data
Feb. 2, 2012 (JP) ................ 2012-020572

(51) Int. Cl.
B05C 17/04 (2006.01)
B41F 15/44 (2006.01)
H05K 3/12 (2006.01)
B41F 15/08 (2006.01)
B41F 15/12 (2006.01)
B41F 15/36 (2006.01)
B41F 15/42 (2006.01)

(52) U.S. Cl.
CPC .............. *B41F 15/44* (2013.01); *H05K 3/1233* (2013.01); *H05K 2203/163* (2013.01); *B41F 15/0881* (2013.01); *B41F 15/12* (2013.01); *B41F 15/36* (2013.01); *B41F 15/42* (2013.01); *B41P 2215/50* (2013.01)

(58) Field of Classification Search
USPC .................................. 101/123, 124, 126, 129
See application file for complete search history.

(56) References Cited

U.S. PATENT DOCUMENTS 8,342,381 B2 * 1/2013 Sumioka ................ 228/102
2012/0138664 A1 6/2012 Sumioka

FOREIGN PATENT DOCUMENTS

JP 02-132879 A 5/1990
JP 5-35272 U 5/1993
(Continued)

OTHER PUBLICATIONS

International Search Report for PCT/JP2012/005770 dated Oct. 16, 2012.

*Primary Examiner* — Ren Yan
*Assistant Examiner* — Marissa Ferguson Samreth
(74) *Attorney, Agent, or Firm* — Pearne & Gordon LLP

(57) ABSTRACT

A light receiving section 27b receives a measurement beam, which is cast from a light projection section 27a and partially blocked by cream solder 19 scraped up by a squeegee 16, whereby a sensor 27 measures a one-dimensional size of a predetermined region of a cross sectional profile of the cream solder 19 as a cross sectional paste length and takes the cross sectional paste length as an index for an amount of residual cream solder 19. The amount of residual cream solder 19 can be numerically grasped at all times, so that versatility and accuracy in detecting the amount of residual cream solder 19 can be assured.

7 Claims, 8 Drawing Sheets

(56) References Cited

FOREIGN PATENT DOCUMENTS

| | | |
|---|---|---|
| JP | 05-200975 A | 8/1993 |
| JP | 5-77357 B2 | 10/1993 |
| JP | 06-328661 A | 11/1994 |
| JP | 08-323956 A | 12/1996 |
| JP | 11-138747 A | 5/1999 |
| JP | 2001035870 A * | 2/2001 |
| JP | 2008-074054 A | 4/2008 |
| JP | 2010-179628 A | 8/2010 |

* cited by examiner

SCREEN PRINTER AND METHOD FOR DETECTING AMOUNT OF RESIDUAL PASTE

TECHNICAL FIELD

The invention relates to a screen printer that prints a substrate with paste, like cream solder and a conductive paste, and an amount-of-residual-paste detection method for detecting an amount of residual paste in the screen printer.

BACKGROUND ART

Screen printing has been used in an electronic component mounting step as a method for printing a substrate with paste, like cream solder and a conductive paste. The method includes setting a substrate on a screen mask with pattern holes opened and aligned with locations of print targets and slidably moving a squeegee over the screen mask supplied with paste, thereby printing the substrate with the paste through the pattern holes. During screen printing, the paste fed over the screen mask is consumed as a result of repeated performance of squeegeeing action for slidably moving the squeegee, which decreases an amount of paste remaining on the screen mask. The paste is replenished at timing when the amount of residual paste falls short of a specified amount of paste.

In order to adequately set the paste replenishment timing, a hitherto-known screen printer has a paste detection function for detecting whether or not a specified amount of paste still exists on a screen mask (see; for instance, Patent Document 1). According to the related art described in connection with the patent document, an amount of paste remaining on the screen mask is detected on the basis of whether or not a sensor placed at a fixed position previously set as a point of detection detects paste.

RELATED ART DOCUMENT

Patent Document

Patent Document 1: JP-U-5-035272

SUMMARY OF THE INVENTION

Problem that the Invention is to Solve

However, the related art of detecting an amount of residual paste on the basis of whether paste still exits at the preset point of detection, including the technique described in connection with the patent document, has the following drawbacks. Specifically, presence/absence of paste at the fixed position set as the point of detection is detected in the related art. However, when a specified amount serving as a criterion for paste replenishment varies according to a substrate type or a paste type, a sensor position must be adjusted in agreement with a specified amount each time. The technique has a problem of lack of capacity to deal with multi-objective production and versatility. Moreover, the configuration includes detecting paste only at the location of the sensor placed at the fixed position. Accordingly, an amount of residual paste cannot always be detected at appropriate timing, and difficulties are encountered in assuring the precision of detection of a residual amount. As above, there has been a problem of difficulties in assuring versatility and detection accuracy ascribable to the paste detection configuration in relation to detection of residual paste in the related-art screen printer.

Accordingly, the invention aims at providing a screen printer that exhibits superior versatility and accuracy in detecting an amount of residual paste and a method for detecting residual paste.

Means for Solving the Problem

A screen printer of the invention is directed toward a screen printer that brings a substrate into contact with a screen mask with pattern holes and prints the substrate with paste through the pattern holes by means of squeegeeing operation for sliding a squeegee over the screen mask supplied with the paste, the printer comprising: a substrate positioning section that holds and positions the substrate with respect to the screen mask, a screen printing mechanism that vertically and horizontally moves a squeegee head with the squeegee, to thus perform the squeegeeing operation, and an amount-of-residual-paste detection section for detecting an amount of paste remaining on the screen mask, wherein the amount-of-residual-paste detection section has a sensor that is integrally moved along with the squeegee head, that is made up of a light projection section and a light receiving section, which are disposed opposite each other, and that can measure a one-dimensional size of a measurement target, and an amount-of-residual-paste calculation section that estimates and calculates an amount of residual paste from a measurement result of the sensor; the light receiving section receives a measurement beam, which is cast from the light projection section and partially blocked by the paste scraped up by the squeegee, whereby the sensor measures a one-dimensional size of a predetermined region of a cross sectional profile of the paste as a cross sectional paste length; and the amount-of-residual-paste calculation section takes the cross sectional paste length as an index for the amount of residual paste.

A method for detecting an amount of residual paste of the invention is directed toward an amount-of-residual-paste detection method for detecting an amount of residual paste in a screen printer that brings a substrate into contact with a screen mask with pattern holes and prints the substrate with paste through the pattern holes by means of squeegeeing operation for sliding a squeegee over the screen mask supplied with the paste, wherein the printer comprise a substrate positioning section that holds and positions the substrate with respect to the screen mask, a screen printing mechanism that vertically and horizontally moves a squeegee head with the squeegee, to thus perform the squeegeeing operation, a sensor that is integrally moved along with the squeegee head, that is made up of a light projection section and a light receiving section, which are disposed opposite each other, and that can measure a one-dimensional size of a measurement target, and an amount-of-residual-paste calculation section that estimates and calculates an amount of residual paste from a measurement result of the sensor, and wherein, in an amount-of-residual-paste detection step of detecting an amount of paste remaining on the screen mask, the light receiving section receives a measurement beam, which is cast from the light projection section and partially blocked by the paste scraped up by the squeegee, whereby the sensor measures a one-dimensional size of a predetermined region of a cross sectional profile of the paste as a cross sectional paste length, and the amount-of-residual-paste calculation section takes the cross sectional paste length as an index for the amount of residual paste.

Advantage of the Invention

According to the invention, in the amount-of-residual-paste detection step of estimating and detecting an amount of paste remaining on the screen mask on the basis of a measurement result of the sensor that is integrally moved along with the squeegee head, that is made up of the light projection section and the light receiving section, both being disposed opposite each other, and that can measure a one-dimensional size of a measurement target, the light receiving section receives a measurement beam, which is cast from the light projection section and partially blocked by the paste scraped up by the squeegee, whereby the sensor measures a one-dimensional size of a predetermined region of a cross sectional profile of the paste as a cross sectional paste length, and the cross sectional paste length is taken as an index for the amount of residual paste. Thus, the amount of residual paste can be numerically grasped at all times, so that versatility and accuracy in detecting the amount of residual paste can be assured at all times.

EMBODIMENT FOR IMPLEMENTING THE INVENTION

Figure 1:
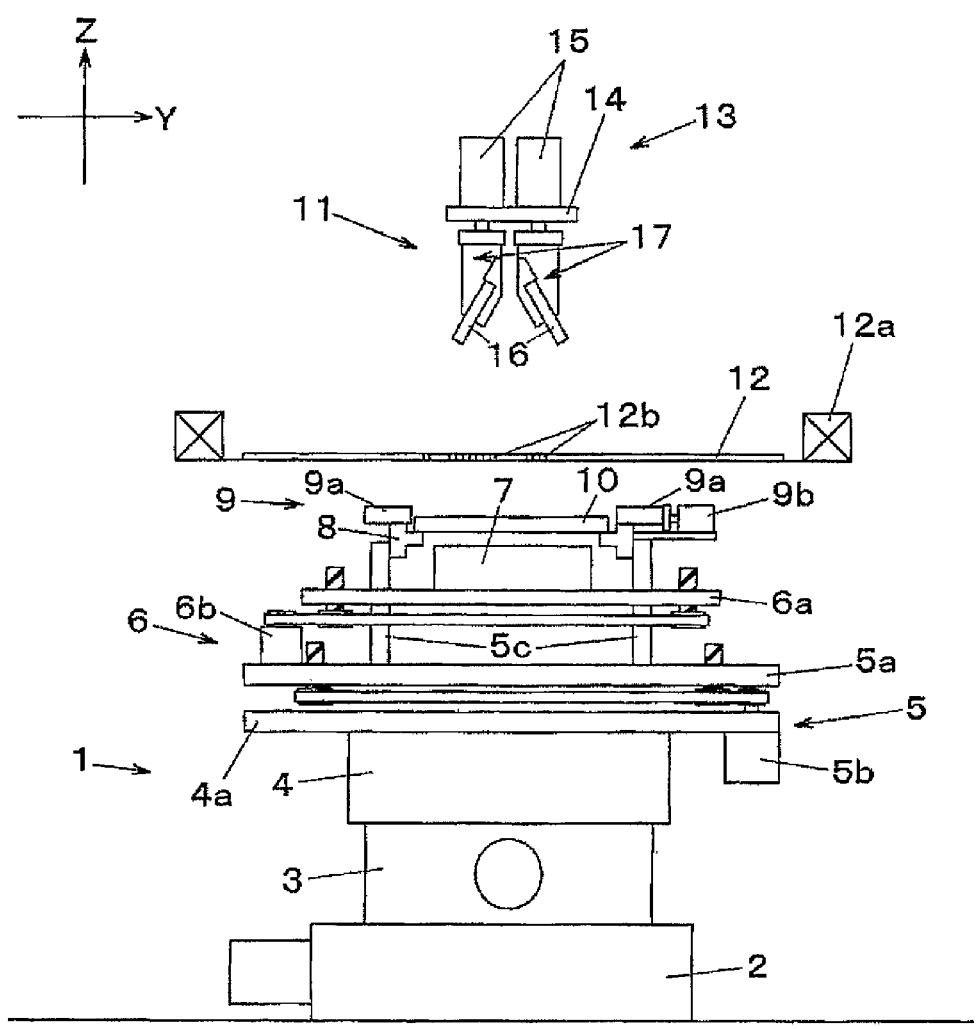
FIG. 1 is a side view of a screen printer of an embodiment of the invention.

An embodiment of the invention is now described by reference to the drawings. First, a structure of a screen printer is described by reference to FIGS. 1, 2, and (a) and (b) in FIG. 3. In FIG. 1, the screen printer is made up of a substrate positioning section 1 and a screen printing mechanism 11 placed above the substrate positioning section 1. The substrate positioning section 1 is assembled by placing, one on top of the other and in order from the bottom, a Y-axis table 2, an X-axis table 3, and a θ-axis table 4 in combination with a first Z-axis table 5 and a second Z-axis table 6 to be additionally placed in this order on the θ-axis table 4.

A configuration of the first Z-axis table 5 is described. A horizontal base plate 5a is held in a vertically movable manner, by an elevation guide mechanism (not shown), on an upper surface side of a similarly horizontal base plate 4a put on an upper surface of the θ-axis table 4. The base plate 5a is moved up and down by means of a Z-axis elevation mechanism that is configured so as to rotationally actuate a plurality of feed screws 5c by way of a belt 5d with a motor 5b.

Figure 2:
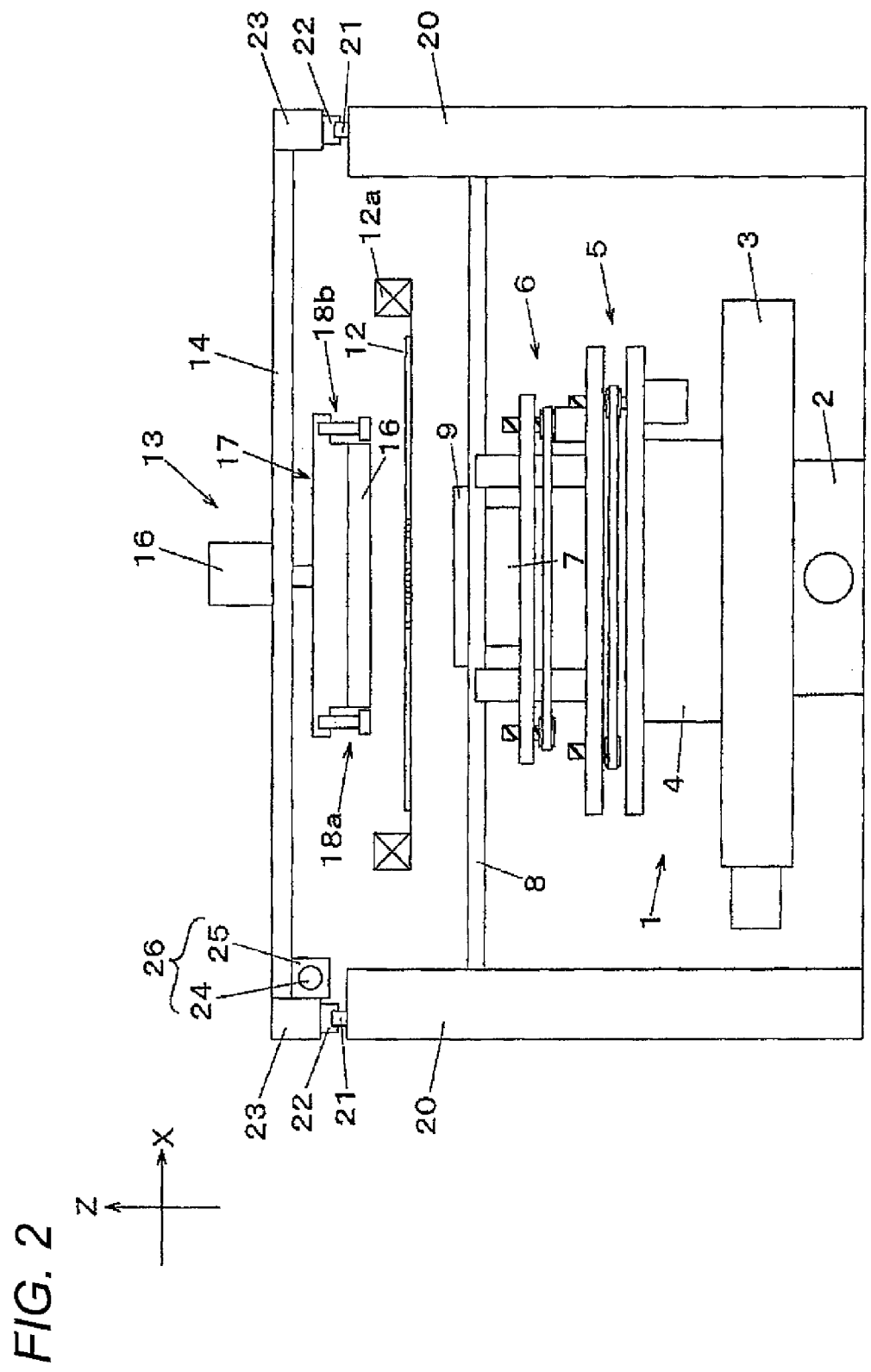
FIG. 2 is a front view of the screen printer of the embodiment of the invention.
Figure 3:
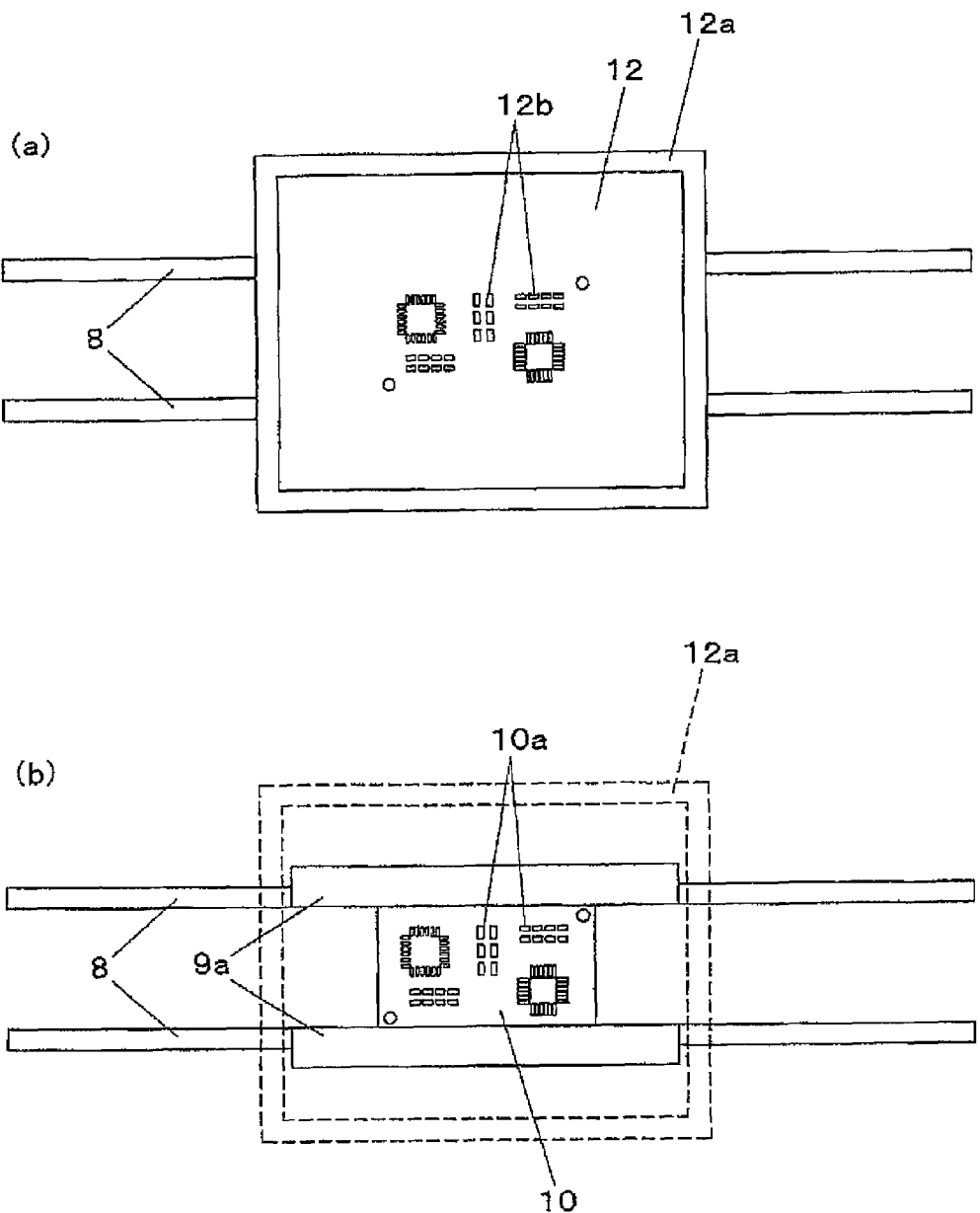
FIG. 3 is view in which (a) and (b) show plan views of the screen printer of the embodiment of the invention.

Vertical frames 5e stand upright on the base plate 5a, and a substrate conveyance mechanism 8 is held at upper ends of the vertical frames 5e. The substrate conveyance mechanism 8 has two rows of conveyance rails laid in parallel to each other along a direction in which a substrate is conveyed (a direction X: a direction perpendicular to a drawing sheet in FIG. 1). A substrate 10 that is a print target is conveyed while both sides of the substrate are supported by the conveyance rails. By means of moving the first Z-axis table 5, the substrate 10 held by the substrate conveyance mechanism 8 can be moved up and down with respect to the screen printing mechanism 11 along with the substrate conveyance mechanism 8. As shown in FIG. 2 and (a) and (b) in FIG. 3, the substrate conveyance mechanism 8 has a stretch in both an upstream side (left sides in FIG. 2 and (a) and (b) in FIG. 3) and a downstream side. The substrate 10 conveyed from the upstream side is conveyed by the substrate conveyance mechanism 8 and further positioned by means of the substrate positioning section 1. The substrate 10 printed by the screen printing mechanism 11 is conveyed downstream by means of the substrate conveyance mechanism 8.

A configuration of the second Z-axis table 6 is now described. Between the substrate conveyance mechanism 8 and the base plate 5a is interposed a horizontal base plate 6a so as to be capable of vertical elevation by means of the elevation guide mechanism (omitted from the drawings). The base plate 6a moves up and down by means of a Z-axis elevation mechanism that is configured so as to rotationally actuate a plurality of feed screws 6c by way of a belt 6d with a motor 6b. A substrate lower support section 7 whose upper surface acts as a lower support surface for holding the substrate 10 is placed on an upper surface of the base plate 6a.

By means of movement of the second Z-axis table 6, the substrate lower support section 7 moves up and down with respect to the substrate 10 held by the substrate conveyance mechanism 8. As a result of the lower support surface of the substrate lower support section 7 contacting a lower surface of the substrate 10, the substrate lower support section 7 comes to support the substrate 10 from its lower surface side. A clamp mechanism 9 is placed on an upper surface of the substrate conveyance mechanism 8. The clamp mechanism 9 has two clamping members 9a disposed on right and left sides so as to oppose each other. The substrate 10 is fixedly clamped from both sides by causing one clamping member 9a to move forward or backward by means of a drive mechanism 9b.

The screen printing mechanism 11 placed at a position above the substrate positioning section 1 is now described. In FIGS. 1 and 2, a screen mask 12 is extended over a mask frame 12a. Pattern holes 12b are formed in the screen mask 12 in conformity with shapes and positions (see (a) and (b9 in FIG. 3) of electrodes 10a that are to be print targets of the substrate 10. A squeegee unit 13 is placed above the screen mask 12. The squeegee unit 13 has a configuration in which a horizontal moving plate 14 is equipped with squeegee elevation mechanisms 15 that vertically move respective squeegees 16 held by squeegee holders 17. The squeegees 16 move up and down along with the squeegee holders 17 by activating the squeegee elevation mechanisms 15, to thus contact an upper surface of the screen mask 12. In the squeegee unit 13, sensor units 18a and 18b are disposed, one at one lateral end of the squeegee holder 17 and the other at the other lateral end of the same, to detect an amount of residual cream solder 19 (see (b) in FIG. 4) that is paste on the screen mask 12.

As shown in FIG. 2, each of guide rails 21 is laid on top of each of vertical frames 20 along direction Y. Each of sliders 22 slidably fitted to the respective guide rails 21 is joined to each of ends of the moving plate 14 by way of a joint member 23. The squeegee unit 13 thereby becomes slidably in the direction Y. The moving plate 14 is horizontally moved along the direction Y with squeegee moving means 26, each of which is made up of a nut 25, a feed screw 24, and a squeegee moving motor (omitted from the drawings) that rotationally actuates the feed screw 24.

Figure 4:
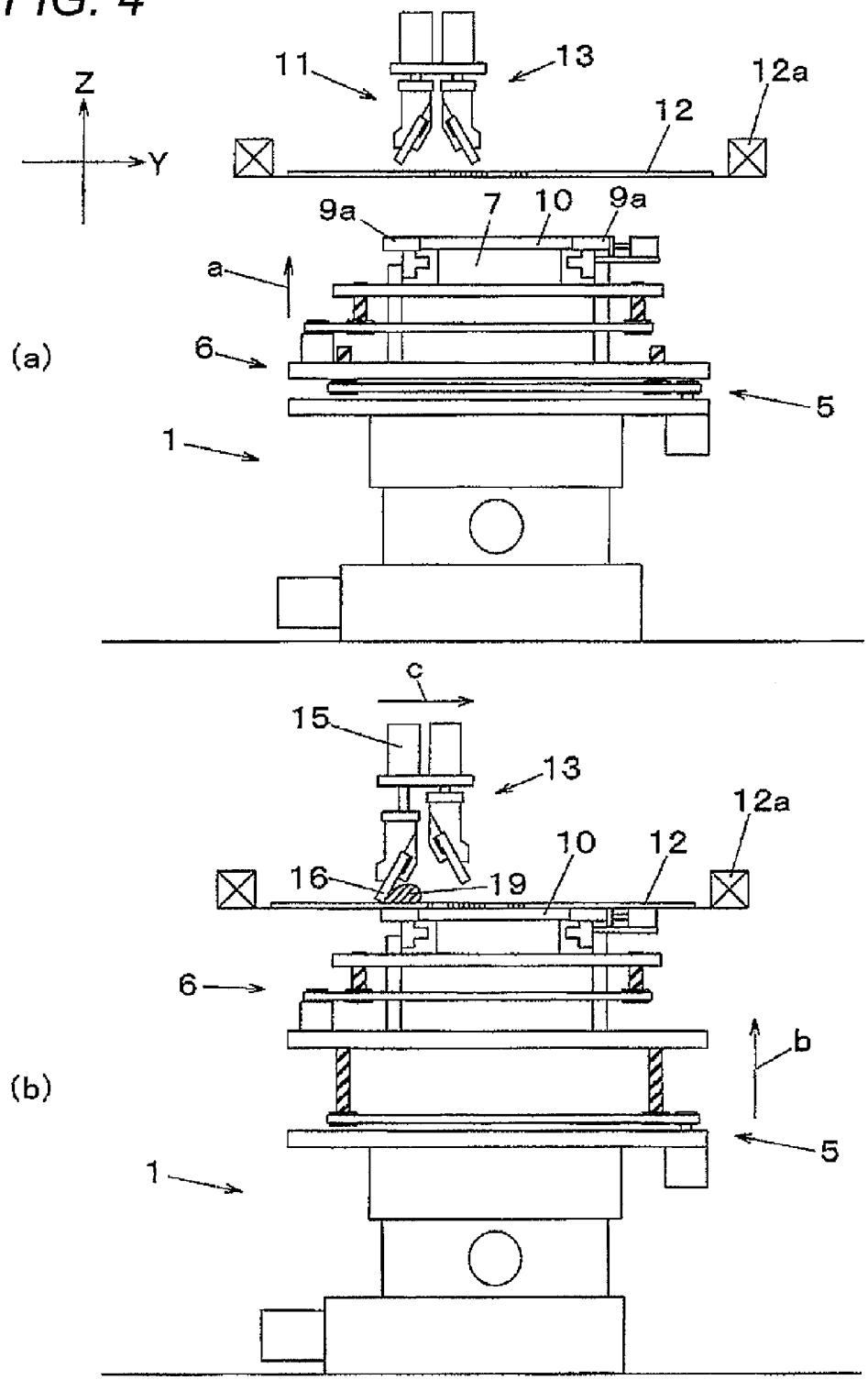
FIG. 4 is view in which (a) and (b) show descriptive views of operation of the screen printer of the embodiment of the invention.

Printing operation performed by the screen printing mechanism 11 is now described by reference to (a) and (b) in FIG. 4. First, when the substrate 10 is conveyed to a print position with the substrate conveyance mechanism 8, the second Z-axis table 6 is moved, to thus upwardly move the substrate lower support section 7 (as indicated by arrow "a") to support the lower surface of the substrate 10 from below as shown in (a) in FIG. 4. The substrate 10 is clamped with and sandwiched between the clamping members 9a. The substrate positioning section 1 is moved in this state, thereby positioning the substrate 10 with respect to the screen mask 12.

Subsequently, as shown in (b) in FIG. 4, the first Z-axis table 5 is moved, to thus move the substrate 10 up (ad indicated by arrow "b") along with the substrate conveyance mechanism 8 and bring the substrate 10 into contact with the lower surface of the screen mask 12. During squeegeeing operation performed by the squeegee unit 13, the substrate 10 is thereby fixedly positioned with respect to the screen mask 12. In this state, there is performed squeegeeing operation for sliding the squeegees 16 over the screen mask 12 (as indicated by arrow "c") supplied with the cream solder 19 that is paste, whereby the substrate 10 is printed with the cream solder 19 through the pattern holes 12b. Specifically, the screen printing mechanism 11 causes the squeegees 16 to perform squeegeeing operation by moving the squeegee unit 13 equipped with the squeegees 16 up or down as well as in a horizontal direction.

Figure 5:
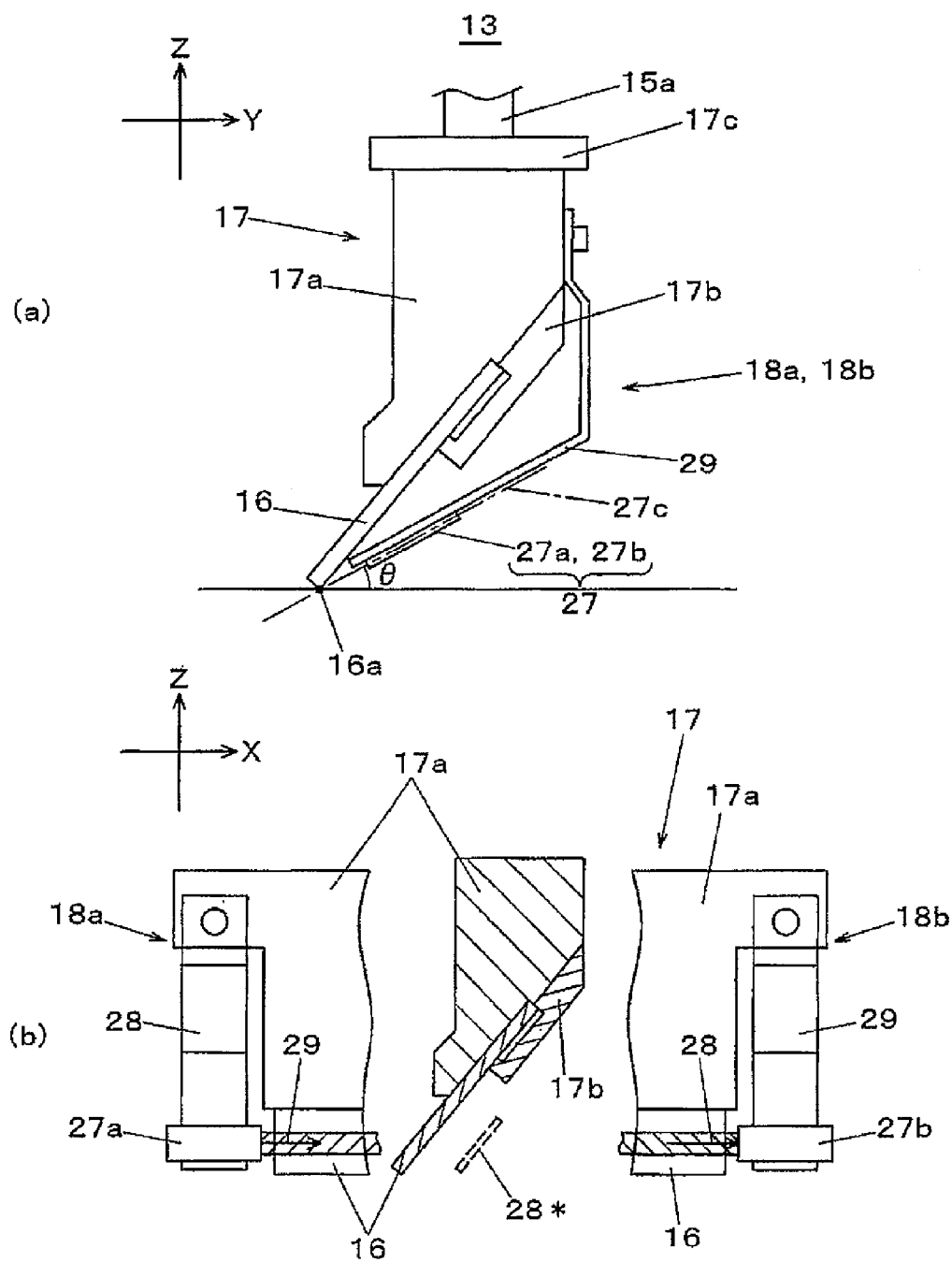
FIG. 5 is view in which (a) and (b) show descriptive views of a configuration of a squeegee holder and a sensor for detecting an amount of residual paste in the screen printer of the embodiment of the invention.
Figure 6:
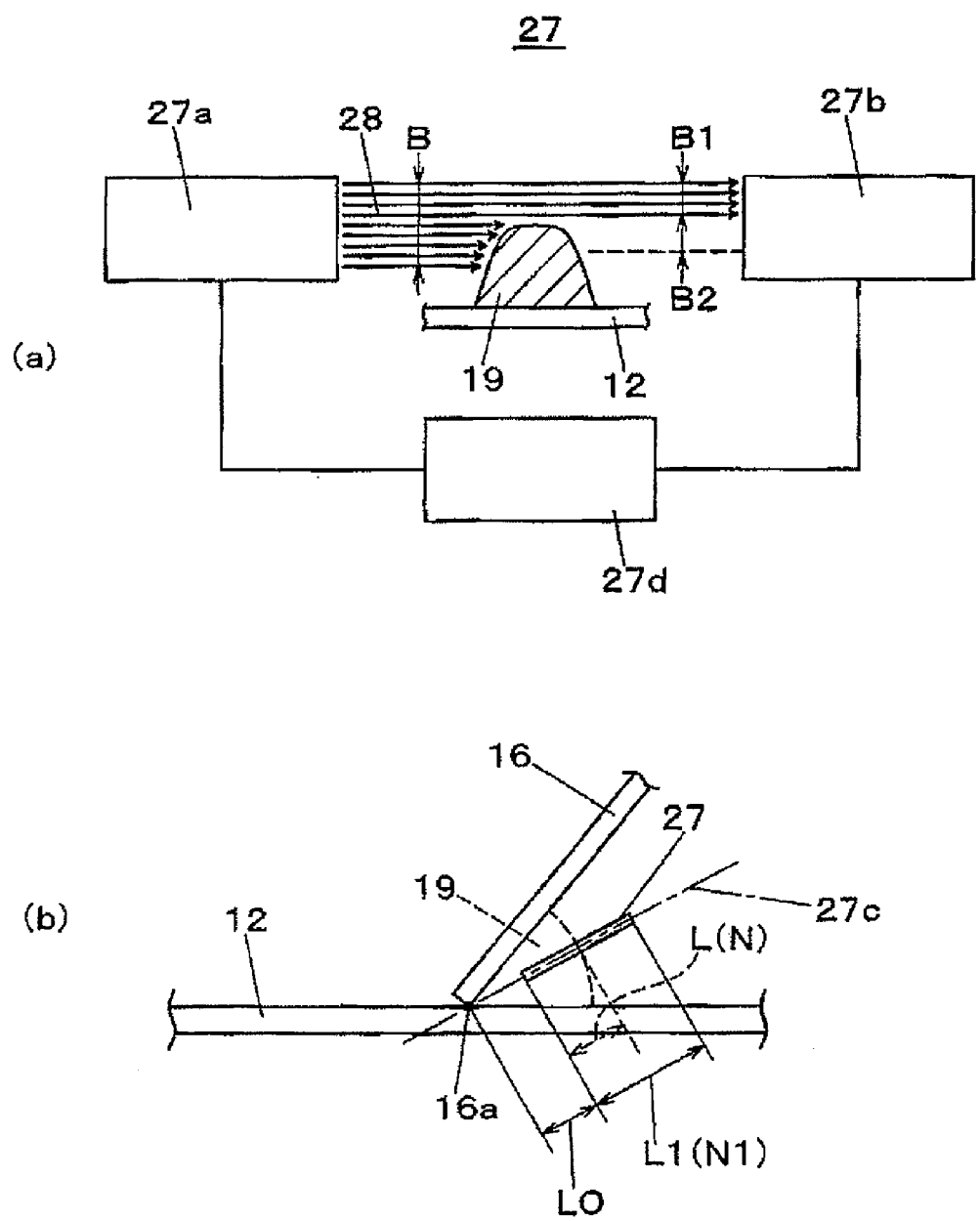
FIG. 6 is view in which (a) and (b) show descriptive views of a function of the sensor for detecting an amount of residual paste in the screen printer of the embodiment of the invention.
Figure 7:
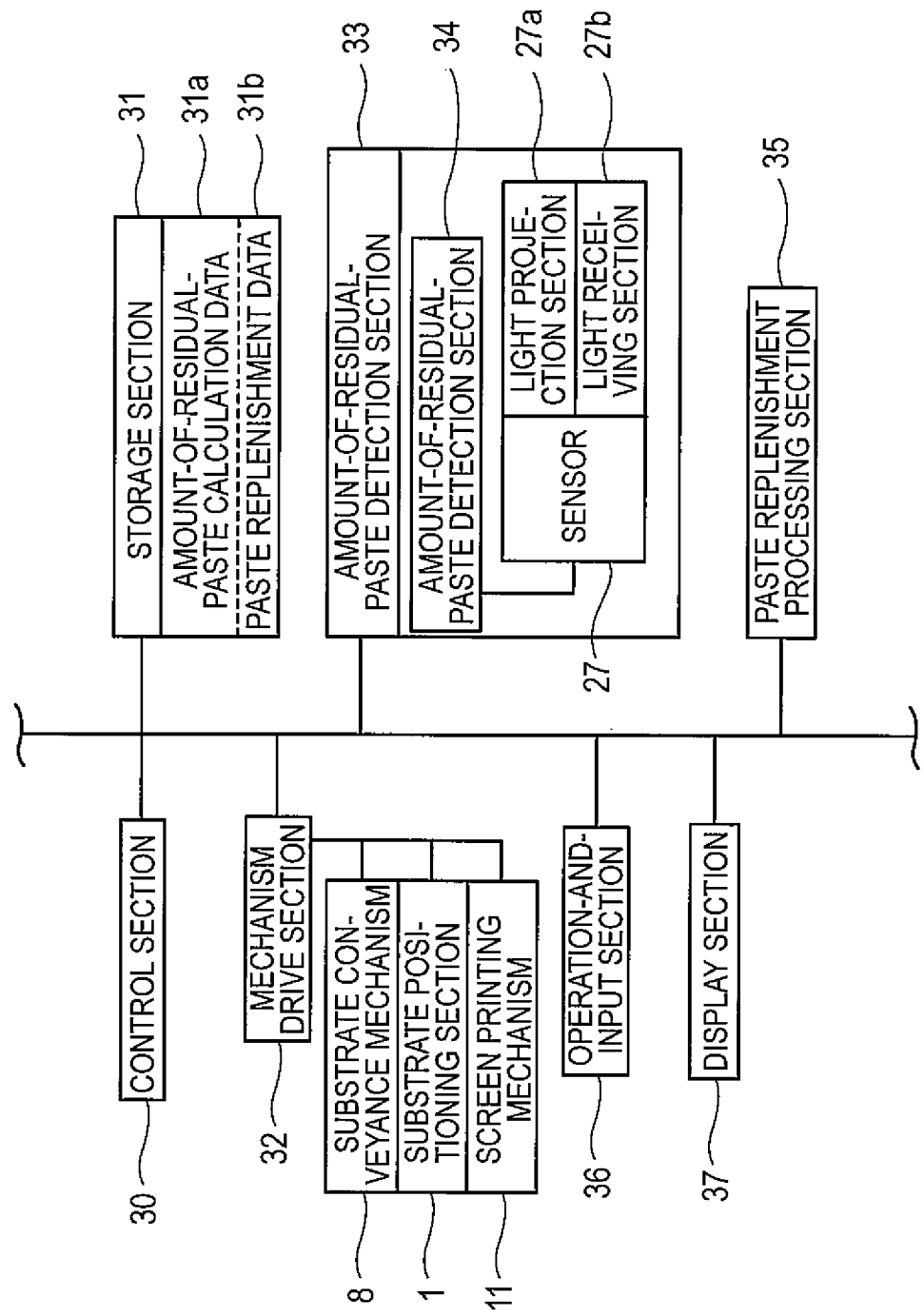
FIG. 7 is a block diagram showing a configuration of a control system of the screen printer of the embodiment of the invention.

By reference to (a) and (b) in FIG. 5, (a) and (b) in FIG. 6, and FIG. 7, explanations are now given to a detailed configuration of the squeegee unit 13 and a configuration and functions of the sensor units 18a and 18b for detecting an amount of residual paste that are provided on the respective lateral end faces of one of the squeegee holders 17 of the squeegee unit 13. As shown in (a) in FIG. 5, the squeegee unit 13 is configured such that each of the plate-like squeegees 16 is held by way of the corresponding squeegee holder 17, while inclined in a squeegeeing direction (the direction Y), with an elevation drive shaft 15a that downwardly extends from the squeegee elevation mechanism 15. Each of the squeegee holders 17 is joined to the elevation drive shaft 15a by way of a joint member 17c. The plate-like squeegee 16 is fixed, while being sandwiched, between a holder base 17a and a nipping member 17b placed on a front surface of the holder base 17a.

The sensor units 18a and 18b are positioned at both lateral ends of the squeegee holder 17 and on the front surface of the squeegee holder 17 in the squeegeeing direction. In the meantime, the essential requirement is that the sensor units 18a and 18b be provided on only one of the two squeegee holders 17. The sensor unit 18a is configured such that a light projection section 27a which makes up the sensor 27 is secured to the squeegee holder 17 by means of a bracket 29 having a shape of a bent plate. The sensor unit 18b is also configured such that a light receiving section 27b which makes up the sensor 27 is secured to the squeegee holder 17 by means of the bracket 29 having the shape of the bent plate.

In connection with layout of the sensor 27, the light projection section 27a and the light receiving section 27b are situated on a front surface of the squeegee 16 in a squeegeeing direction. A sensor center line 27c of the sensor 27 is positioned while inclined at a predetermined angle, with respect to the upper surface of the screen mask 12. A slidable contact point 16a where the squeegee 16 slidably contacts the screen mask 12 is situated in line with a downward extension of the sensor center line 27c.

In a state where the sensor units 18a and 18b are attached to both lateral ends of the squeegee holder 17, the light projection section 27a and the light receiving section 27b are positioned so as to oppose each other as shown in (b) in FIG. 5. In the course of a swath-shaped inspection beam 28 cast from the light projection section 27a passing through an inspection cross sectional region 28* designated by a broken-line frame and arriving at the light receiving section 27b, there is measured a size of a measurement target situated at the inspection cross sectional region 28*. In the embodiment, a length measuring sensor is used as the sensor 27. The sensor 27 is configured such that a laser beam emitting element, which is laid in the light projection section 27a in line and which acts as a measurement beam light source, emits the inspection beam 28 and that a light receiving element, like a CCD, which is likewise laid in line at the light receiving section 27b, receives the emitted inspection beam, thereby detecting a one-dimensional size of the measurement target.

As can be seen from the sensor 27 shown in (a) in FIG. 6, the sensor 27 is made up of the light projection section 27a, the light receiving section 27b, and a controller 27d. When the cream solder 19 that is a measurement target exists in a path along which the swath-shaped inspection beam 28 cast at a projection width B from the light projection section 27a arrives at the light receiving section 27b, the light receiving section 27b does not receive a shield width B2 of the inspection beam 28 equivalent to a size of the cream solder 19. The light receiving section 27b receives only a light receive width B1 of the inspection beam 28. Upon receipt of a result pertaining to the received light, the controller 27d measures the shield width B2; namely, a one-dimensional size of the cream solder 19 in the measurement target area, in the form of a digital sensor value.

(b) in FIG. 6 shows an index used when the sensor 27 having such a function detects an amount of cream solder 19 still remaining on the upper surface of the screen mask 12. The sensor 27 can measure a length within a measurement range L1. On occasion of selection of the sensor 27, a sensor with the measurement range L1 that is necessary, sufficient to measure the amount of residual cream solder 19 is selected. As shown in (a) in FIG. 5, the sensor 27 is placed at a position at which the sensor center line 27c is inclined at a predetermined angle with respect to the screen mask 12 and a position at which a measurement starting edge is spaced from the point of slidable contact 16a by a predetermined distance L0.

By means of the layout of the sensor 27, an outer edge of a cross sectional profile of the cream solder 19 which is scraped up by the squeegee 16 during squeegeeing operation falls within the measurement range L1 of the sensor 27. As a result of activation of the sensor 27 with such a layout, a digital sensor value N that is equivalent to a length (a measured length L) from the measurement starting edge to the outer edge of the cream solder 19 is output as a measurement result. An amount-of-residual-paste calculation section 34 (see FIG. 7) estimates and calculates an amount of residual cream solder 19 from the result of measurement.

Specifically, the light receiving section 27b receives the inspection beam 28 that has been cast from the light projection section 27a and partially blocked by the cream solder 19 scraped up by the squeegee 16, whereby the sensor 27 measures, as a cross sectional paste length, a one-dimensional size of a predetermined region of the cross sectional profile of the cream solder 19. During estimation and calculation of the amount of residual cream solder 19, the amount-of-residualpaste calculation section 34 takes the cross sectional paste length as an index for the amount of residual cream solder 19.

To be exact, the cross sectional paste length corresponds to a total sum of the predetermined distance L0 from the point of slidable contact 16a and the measured length L. However, since the predetermined distance L0 is a fixed value, there is no problem in using the measured length L as an index for managing the amount of residual paste. The cross sectional paste length employed in this case corresponds to a length of a straight line set at a predetermined angle θ with respect to the upper surface of the screen mask 12; namely, a length of the straight line along the sensor center line 27c, in the cross-sectional profile of the cream solder 19 scraped up by means of the squeegee 16.

In relation to the layout and position of the sensor 27, the sensor center line 27c does not always need to be aligned to the point of slidable contact 16a. The sensor 27 can assume any position, so long as an index showing a cross sectional length of the scraped-up cream solder 19 can be acquired. Moreover, any sensor having a configuration other than the configuration for receiving a laser beam with a CCD can be employed as the sensor 27, so long as the sensor has a function of being able to acquire a cross sectional paste length by means of a measurement target blocking the beam emitted from the light projection section 27a.

By reference to FIG. 7, a configuration of a control system is now described. In FIG. 7, a control section 30 is a CPU that has an arithmetic processing function, and controls operation/processing of the following individual sections according to a program and data stored in a storage section 31. In addition to a print operation program and print condition data used for performing screen printing operation, the storage section 31 stores amount-of-residual-paste calculation data 31a and paste replenishment data 31b. The amount-of-residual-paste calculation data 31a correspond to data that are required to calculate an amount of residual cream solder 19 from a measurement result of the sensor 27. The paste replenishment data 31b correspond to data used for appropriately replenishing paste on the basis of a result of measurement of the amount of residual cream solder 19. In the embodiment, the data are set in advance for each type of paste, whereby paste replenishment timing and an appropriate amount of paste to be replenished are automatically reported.

Under control of the control section 30, a mechanism control section 32 activates the substrate conveyance mechanism 8, the substrate positioning section 1, and the screen printing mechanism 11. Substrate conveyance work, positioning work, and screen printing work, all of which are targeted for the substrate 10, are thereby performed. An amount-of-residual-paste detection section 33 performs processing for detecting an amount of cream solder 19 still remaining on the screen mask 12. The amount-of-residual-paste detection section 33 has the sensor 27 and the amount-of-residual-paste calculation section 34. As shown in (a) in FIG. 6, the sensor 27 is configured such that the light projection section 27a and the light receiving section 27b, which integrally move along with the squeegee holders 17 of the squeegee unit 13, are positioned so as to oppose each other. The controller 27d outputs a received light signal from the light receiving section 27b to the amount-of-residual-paste calculation section 34 in a form of a specified sensor value. The amount-of-residual-paste calculation section 34 performs processing for estimating and calculating an amount of residual cream solder 19 from the measurement result of the sensor 27.

A paste replenishment processing section 35 performs processing for reporting, on a display screen of a display section 37, timing at which replenishment of the cream solder 19 is required or an amount of cream solder 19 required to be replenished, from the amount of residual cream solder 19 calculated by the amount-of-residual-paste detection section 33 and the paste replenishment data 31b stored in the storage section 31. An operation-and-input section 36 is an input device, like a keyboard and a touch panel, and inputs an operation command for activating the screen printer or data to be stored in the storage section 31. The display section 37 is a display device, like a liquid crystal panel, and displays a guide screen of input operation to be performed by the operation-and-input section 36 and various report screens.

Figure 8:
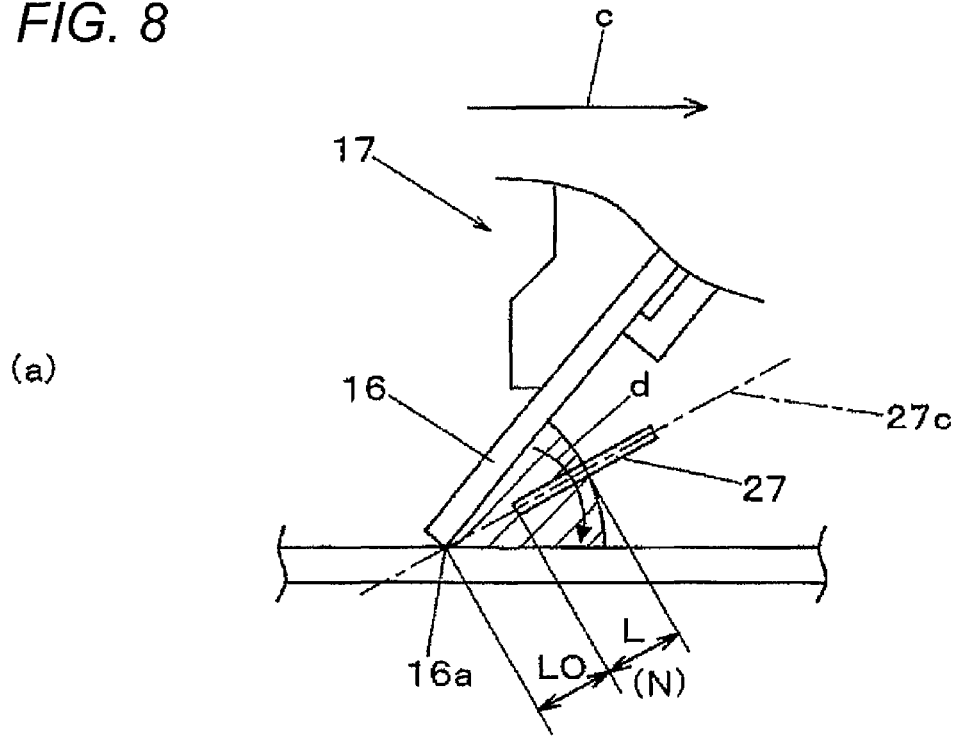
FIG. 8 is view in which (a) and (b) show descriptive views of paste replenishment data in the screen printer of the embodiment of the invention.

By reference to (a) and (b) in FIG. 8, explanations are given to an amount-of-residual-paste detection method for detecting the amount of cream solder 19 still remaining on the screen mask 12 in the screen printer of the embodiment. (a) in FIG. 8 shows an amount-of-residual-paste detection step for detecting an amount of residual paste by measuring the cream solder 19 with the sensor 27 in the course of squeegeeing operation shown in (b) in FIG. 4. In the step, the cream solder 19 that has been scraped up by the squeegee 16 and stays in a rolling state in which the solder flows and rotates (as designated by arrow "d") is measured by the sensor 27, to thus obtain the measured length L which is a one-dimensional size of the cross sectional profile of the cream solder 19 along the sensor center line 27c.

Specifically, in the embodiment, the amount-of-residual-paste detection section 33 is designed so as to measure a cross sectional paste length for which the cream solder 19 that is scraped up by the squeegee 16 and that stays in a rolling state is a target. As a result, it has become possible to detect an accurate measurement value at timing when the cream solder 19 remaining on the screen mask 12 assumes a shape most suitable for measuring the amount of residual paste.

As shown in (a) in FIG. 6, in the amount-of-residual-paste detection step, the light receiving section 27b receives the inspection beam 28 that has been cast from the light projection section 27a and is partially blocked by the cream solder 19. Thus, the sensor 27 measures a one-dimensional size of a predetermined region in the cross sectional profile of the cream solder 19 as a length of a paste cross section. The amount-of-residual-paste detection section 33 is configured so as to take a measured cross sectional paste length as an index for the amount of residual cream solder 19. Specifically, the measured length L serving as a cross sectional paste length is determined by means of amount-of-residual-paste detection. As mentioned above, there is shown an example in which a sole measured length L is taken as a cross sectional paste length, which is an index for managing an amount of residual paste, in place of a total sum of the predetermined distance L0 and the measured length L.

When the amount of residual cream solder 19 decreases to a preset, specified value in the course of detection of an amount of residual paste, the display section 37 displays paste replenishment timing by means of the function of the paste replenishment processing section 35. Further, the amount-of-residual-paste calculation section 34 displays an amount of paste required to be replenished by means of the function of the paste replenishment processing section 35. An operator can replenish an appropriate amount of cream solder 19 without fail at appropriate timing, so that occurrence of a print failure, which would otherwise be caused by an excess or deficiency in cream solder 19, can be prevented.

(b) in FIG. 8 shows an example of the paste replenishment data 31b to which a reference is made during paste replenishment processing. A replenishment timing sensor value 31d (Na, Nb, Nc, . . . ) corresponding to appropriate replenishment timing is individually set for each "paste type" 31c (AAA, BBB, CCC, ... ). The replenishment timing sensor values Na, Nb, Nc, ... correspond to actual cross sectional paste lengths (La, Lb, Lc, ... ). As mentioned above, the amount-of-residual-paste detection section 33 described in connection with the embodiment is configured so as to numerically detect the amount of residual cream solder 19 at all times by means of the cross sectional paste length measured by the sensor 27. Therefore, even when an appropriate amount of residual paste during paste replenishment varies according to a type of paste used, an appropriate amount of residual paste can be managed by means of simply setting the replenishment timing sensor values 31d in advance.

As described above, in the screen printer and detection of an amount of residual paste described in connection with the embodiment, the sensor 27 capable of measuring a one-dimensional size of a measurement target is configured so as to integrally move along with the squeegee unit 13, wherein the light projection section 27a and the light receiving section 27b are positioned opposite each other. In the amount-of-residual-paste detection step of estimating and calculating the amount of cream solder 19 still remaining on the screen mask 12 on the basis of a measurement result of the sensor 27, the light receiving section 27b receives the measurement beam that is cast from the light projection section 27a and partially blocked by the cream solder 19 which has been scraped up by the squeegee 16. The sensor 27 thereby measures a one-dimensional size of a predetermined region of the cross sectional profile of the cream solder 19 as a cross sectional paste length. The thus-measured cross sectional paste length is taken as an index for the amount of residual cream solder 19. The amount of residual cream solder 19 can be numerically grasped at all times, and versatility and accuracy in detecting the amount of residual cream solder 19 can be assured.

The patent application is based on Japanese Patent Application (JP-2012-020572) filed on Feb. 2, 2012, the subject matter of which is incorporated herein by reference in its entirety.

INDUSTRIAL APPLICABILITY

The screen printer of the invention and the method for detecting an amount of residual paste of the invention yield an advantage of the ability to assure versatility and accuracy in detecting an amount of residual paste and are useful in a field where a substrate is printed with paste, such as cream solder.

DESCRIPTIONS OF THE REFERENCE NUMERALS AND SYMBOLS

1 SUBSTRATE POSITIONING SECTION
10 SUBSTRATE
11 SCREEN PRINTING MECHANISM
12 SCREEN MASK
12b PATTERN HOLE
13 SQUEEGEE UNIT
15 SQUEEGEE ELEVATION MECHANISM
16 SQUEEGEE
17 SQUEEGEE HOLDER
18a, 18b SENSOR UNIT
19 CREAM SOLDER (PASTE)
27 SENSOR
27a LIGHT PROJECTION SECTION

The invention claimed is:

1. A screen printer that brings a substrate into contact with a screen mask with a pattern hole and prints the substrate with paste through the pattern hole by squeegeeing operation for sliding a squeegee over the screen mask supplied with the paste, the printer comprising:
a substrate positioning section that holds and positions the substrate with respect to the screen mask;
a screen printing mechanism that vertically and horizontally moves a squeegee head with the squeegee so as to perform the squeegeeing operation; and
an amount-of-residual-paste detection section detecting an amount of paste remaining on the screen mask;
wherein the amount-of-residual-paste detection section has a sensor that is integrally moved along with the squeegee head, and that can measure one dimensional size of a measurement target, and an amount-of-residual-paste calculation section that estimates and calculates an amount of residual paste from a measurement result of the sensor, wherein the sensor includes a light projection section at one end and a light receiving section at the other end, which are disposed opposite each other in a width direction of the squeegee, and the sensor is placed at a position at which a sensor center line of the sensor is inclined at a predetermined angle with respect to an upper surface of the screen mask;
the light receiving section receives a measurement beam, which is cast from the light projection section and partially blocked by the paste scraped up by the squeegee, whereby the sensor measures a one-dimensional size of a predetermined region of a cross sectional profile of the paste as a cross sectional paste length; and
the amount-of-residual-paste calculation section takes the cross sectional paste length as an index for the amount of residual paste.

2. The screen printer according to claim 1, wherein the cross sectional paste length is a length of a straight line of the cross sectional profile that is set at a predetermined angle with respect to an upper surface of the screen mask.

3. The screen printer according to claim 1, wherein the amount-of-residual-paste detection section measures the cross sectional paste length of the paste that is scraped up by the squeegee and stays in a rolling state.

4. The screen printer according to claim 1, further comprising a paste replenishment processing section that reports timing when the paste needs to be replenished or an amount of paste needed to be replenished, on the basis of the estimated, calculated amount of residual paste.

5. An amount-of-residual-paste detection method for detecting an amount of residual paste in a screen printer that brings a substrate into contact with a screen mask with pattern holes and prints the substrate with paste through the pattern holes by means of squeegeeing operation for sliding a squeegee over the screen mask supplied with the paste, wherein
the printer comprise a substrate positioning section that holds and positions the substrate with respect to the screen mask, a screen printing mechanism that vertically and horizontally moves a squeegee head with the squeegee, to thus perform the squeegeeing operation, a sensor that is integrally moved along with the squeegee head, that includes a light projection section at one end and a light receiving section at the other end, which are disposed opposite each other in a width direction of the squeegee, and that can measure a one-dimensional size of a measurement target, and an amount-of-residual-paste calculation section that estimates and calculates an amount of residual paste from a measurement result of the sensor, wherein the sensor is placed at a position at which a sensor center line of the sensor is inclined at a predetermined angle with respect to an upper surface of the screen mask, and wherein, in an amount-of-residual-paste detection step of detecting an amount of paste remaining on the screen mask, the light receiving section receives a measurement beam, which is cast from the light projection section and partially blocked by the paste scraped up by the squeegee, whereby the sensor measures a one-dimensional size of a predetermined region of a cross sectional profile of the paste as a cross sectional paste length, and the amount-of-residual-paste calculation section takes the cross sectional paste length as an index for the amount of residual paste.

6. The method according to claim 5, wherein the cross sectional paste length is a length of a straight line of the cross sectional profile that is set at a predetermined angle with respect to an upper surface of the screen mask.

7. The method according to claim 5, wherein the amount-of-residual-paste detection section measures the cross sectional paste length of the paste that is scraped up by the squeegee and stays in a rolling state.

\* \* \* \* \*